United States Patent [19]

Sibley

[11] 3,995,173
[45] Nov. 30, 1976

[54] SOLID STATE FAIL-SAFE LOGIC SYSTEM

[75] Inventor: Henry C. Sibley, Adams Basin, N.Y.

[73] Assignee: General Signal Corporation, Rochester, N.Y.

[22] Filed: May 5, 1975

[21] Appl. No.: 574,667

Related U.S. Application Data

[63] Continuation-in-part of Ser. No. 474,638, May 30, 1974, abandoned.

[52] U.S. Cl. .............................. 307/218; 307/311; 307/256; 250/213 A; 250/551
[51] Int. Cl.[2] .......................................... H03K 17/78
[58] Field of Search ...... 307/218, 311, 256, DIG. 1; 317/148.5; 250/213 A, 551, 211

[56] References Cited
UNITED STATES PATENTS

| | | | |
|---|---|---|---|
| 3,535,532 | 10/1970 | Merryman | 250/211 X |
| 3,600,604 | 8/1971 | Thorn-Booth | 307/218 |
| 3,746,942 | 7/1973 | Brown et al. | 317/148.5 R |
| 3,801,832 | 4/1974 | Joyce | 307/311 X |
| 3,809,930 | 5/1974 | Brown et al. | 307/311 |
| 3,819,934 | 6/1974 | Kramer | 317/148.5 R |
| 3,826,930 | 7/1974 | Perry | 307/311 |

OTHER PUBLICATIONS

Microelectronics vol. 13, No. 1 (Apr. 1971) pp. 42–49 "Making use of OCI's as an Interface in Switching Circuits"

*Primary Examiner*—John S. Heyman
*Attorney, Agent, or Firm*—Pollock, Vande Sande & Priddy

[57] ABSTRACT

A solid state fail-safe logic system is disclosed including AND and OR gates which are designed as an evolutionary replacement for signal control functions previously performed by vital front and back contacts of vital relays and power check logic. The AND gate is basic and accepts an a.c. and a d.c. input. The a.c. input circuit includes a light emitting diode optically coupled to a light receiving active circuit means. Leakage currents cannot falsely activate the gate since the light emitting diode is poled to be reverse biased by the supply voltage. The d.c. input is protected from leakage currents by proper connections so that any leakage current is of the wrong polarity to produce an output. The d.c. input provides forward bias for light responsive active circuit means. The AND gate is divided into an input module including the light emitting diode and an output module including the light responsive active circuit means. An OR gate is provided by using an AND gate output module and one AND gate input module for each OR gate input.

More complex logic functions can be implemented and other devices, such as relays, simulated, by combining the AND or OR gates with other circuits.

37 Claims, 13 Drawing Figures

SOLID STATE FAIL-SAFE LOGIC SYSTEM

RELATED APPLICATION

This application is a continuation-in-part of my application Ser. No. 474,638, filed May 30, 1974, now abandoned.

FIELD OF THE INVENTION

This invention relates to solid state logic circuits and more particularly to fail safe solid state logic circuits. Although the inventive system has many applications it is particularly useful as an evolutionary replacement for vital relay equipment in railroad and other applications where fail-safe capabilities are essential.

BACKGROUND OF THE INVENTION

In many applications of electrical and electronic control systems a fail-safe capability is not only desirable but essential. A common characteristic of these applications is that human lives are dependent upon the control system. One class of these applications which comes readily to mind are control systems useful in a railroad environment, such as that of controlling the application of motor and braking power to automatic railroad vehicles in response to signals communicated from the wayside, controlling the clearing of wayside signals and the like. In this class of applications there is a well developed body of art based upon relay technology which enjoys the necessary fail-safe characteristics.

With the advent of solid-state components and circuitry the desirability of replacing the relay devices with solid-state circuits and components was obvious to many skilled in the art. The solid-state components has many qualities which were generally desirable in control system applications. The absence of moving parts meant that many types of relay failures would not be exhibited by the solid-state components. In addition, the absence of mechanically moving parts enabled the solid-state circuits to operate at much higher speeds than did the relay circuits. And finally, the lifetime of solid-state circuits was projected to be greater than that of the relay. However, the solid-state circuits and components also had undesirable qualities which, for many years have prevented their use as a replacement for the relays, especially in circuits where fail-safe capabilities were essential. The solid-state components were subject to catastrophic failures, some of which would necessarily result in a false output indication. Furthermore, false output indications could be generated by reason of leakage currents which, because of the nature of the solid-state components, could not be eliminated. For this reason, although solid-state components have replaced relays in many applications, there are few, if any, solid-state circuits in use today in which fail-safe capability is essential.

Notwithstanding the foregoing a number of solid state fail-safe logic gates have been proposed in the art. Typical of these is Thorne-Booth, U.S. Pat. No. 3,600,604. Thorne-Booth is typical of a number of logic gates which employ transformers to isolate the input and output of the gate. The difficulty with using transformers as an element which will be duplicated as many times as a logic gate is related to the cost and size of a transformer. At the frequencies of the dynamic signals employed herein the transformer in, for instance Thorne-Booth, will be by far the largest element in size. Absent for the necessity for such a transformer, the entire logic gate could, using conventional integrated circuit technology, be placed on a single chip. For at least this reason the cost and size of the Thorne-Booth transformer makes this solution undesirable.

SUMMARY OF THE INVENTION

The present invention provides a solid-state logic system which is capable of replacing relays in applications which require fail-safe characteristics. The invention comprises novel logic circuits such as AND and OR gates, logic circuits to simulate front and back contacts of vital relays and power check logic circuits. The circuit basic to most of these is the AND gate which comprises two modules, an input module and an output module. The AND gate accepts a dynamic input and a static input and produces an output, when both are present which is similar to the dynamic input. The input module comprises two circuit means, one connected to each input, power supply connections and an output. One circuit means of the input module is connected to the dynamic input terminal and a power supply terminal. A light emitting diode is connected in this circuit means and poled so as to be reverse biased by the power supply connection. The light emitting diode is optically coupled to a light responsive active circuit means connected in the second circuit means of the input module. The input to the second circuit means is one terminal of a d.c. input which provides forward bias for the light responsive active circuit means. When properly biased and responding to a light signal from the light emitting diode (hereinafter LED) in the first circuit means the input module produces an outpot signal, from the light responsive active circuit means. The output module is connected to receive this output at one input. The output module has a second input which comprises the second terminal of the d.c. input to the AND gate. One of the d.c. inputs is termed a plus terminal and the second is termed a minus terminal. In order to prevent leakage currents from giving a false indication, the minus terminal may be connected to the system common terminal. In that case, the plus terminal would not be connected to the positive power supply voltage but would derive a positive potential from a vital circuit. Alternatively, the plus terminal could be connected to system common and the minus terminal would be driven by a "super minus", a negative potential greater in magnitude than that available from any power supply. The output of the AND gate is a dynamic signal similar to the dynamic input but with 180° phase shift.

Capacitive means are serially connected to the LED such that only dynamic signals, applied at the dynamic input terminal will activate the LED. This capacitive means prevents leakage currents, which may be present in the output stage at a preceeding gate, from biasing the LED.

The AND gate referred to above is achieved in accordance with this invention without the necessity of employing a transformer as an isolating element. This is a great space and cost saving factor.

An OR gate is fabricated by using the output module of the AND gate with a number of input modules equal in number to the number of inputs to the OR gate. Each of these input modules is connected in multiple to the output module.

A vital driver circuit is provided which, upon application of dynamic signal of proper magnitude and frequency will produce the "super minus" potential referred to above. This driver includes a tuned circuit so that noise, self-oscillation, catastrophic failure of the components or leakage currents cannot give a false output. The "super minus" when provided as an input to a switching circuit will provide either a positive voltage when the "super minus" is absent, and the "super minus" when that signal is provided. Using the vital driver and switching circuit in conjunction with an AND gate can simulate either a back or front contact of a vital relay. When the switching circuit output provides and d.c. input to the AND gate with the positive terminal of the AND gate connected to common, the super minus is necessary to enable the AND gate. When present, this simulates a front contact. Alternatively, if the AND gate has its negative terminal connected to common then the plus output of the switching circuit will enable the AND gate. This performs the same function as the back contact on a vital relay.

Alternatively, the vital driver can be modified by increasing the number of turns in the transformer secondary and reversing the connections of a diode bridge. When so modified, the vital driver will produce a "super plus" signal in response to a dynamic input. This "super plus" is higher than the positive potential supplied by the power source. This "super plus" is then applied as the positive power input to the switching circuit. The signal input to the switching circuit is from an unmodified vital driver. The switching output will then be "super minus" when a "super minus" input is provided and "super plus" when the "super minus" is absent. An AND gate with its negative d.c. input terminal connected to the power supply and its positive d.c. input connected to the switching circuit will be enabled by the presence of the "super plus". A second AND gate with its positive d.c. input connected to a system common and its negative d.c. input connected to the output of the switching circuit will be enabled by the "super minus".

The power check logic is provided in those instances where the output of the logic or driver circuits is inadequate to drive a vital load. The power check logic is connected to the vital loads to sense when power is supplied thereto. Another input to the power check logic is the logic signal which controls the application of power to the load. One d.c. input to the power check logic senses the absence of power to the vital load, and optically couples this signal to an output circuit which provides an input to a vital driver. When power is applied to the vital load this output is inhibited. Instead, an AND gate is enabled by the logic signal which caused the application of power to load and the d.c. input is provided by the voltage applied to the load. When the AND gate is thus enabled it serves to drive the vital driver. If, for any reason, the vital driver does not receive the logic signal the output of the vital driver provides an indication that a false operation has occurred. This is sensed when power is sensed at the load but no logic signal is present to justify it.

As should be clear from the summary the system of this invention provides solid state logic elements which accept dynamic and d.c. inputs to produce an output in a fail-safe fashion. Although these logic elements are not one-for-one replacement for relays they do perform the logic functions for which relays have been used. Furthermore the system includes provision of elements (including the logic element) for simulation of relays, if desired. Of course apparatus which simulates a relay may be substituted for relays on a one-to-one basis.

BRIEF DESCRIPTION OF THE DRAWINGS

The present invention will be described in connection with preferred embodiments thereof which is illustrated in the accompanying drawings and in which like reference characters identify identical apparatus.

In the drawings.

DETAILED DESCRIPTION OF THE INVENTION

Figure 1A:
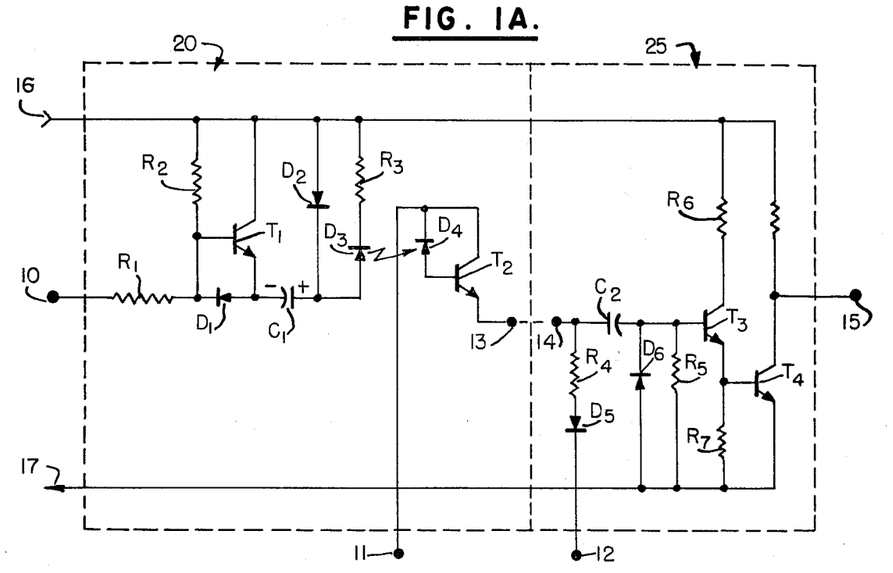
FIG. 1A is a circuit diagram of an AND gate input module 20 and an AND gate output module 25.

FIG. 1A is a circuit diagram for the basic logic gate, the AND gate. FIG. 1A illustrates an AND gate in accordance with the principles of this invention comprising an input module 20 and an output module 25. The input module 20 includes a first circuit means connected between terminals 10 and 16 and a second circuit means connected between terminals 11 and 13. The AND gate terminals 16 and 17 are connected respectively to the positive supply terminal and the system common or supply return. A dynamic input terminal 10 is connected through R1 and R2 to power supply terminal 16. The collector of an impedance means or transistor T1 is also connected to the positive terminal 16 and the base of transistor T1 is connected to the junction of resistor R1 and R2. The emitter of transistor T1 is connected to the anode of a unidirectional conductor means or diode D1 whose cathode is connected to the junction of resistors R1 and R2. One terminal of capacitive means C1 is also connected to the emitter of transistor T1. The other terminal of the capacitive means C1 is connected to the cathode of a diode D2 whose anode is connected to the power supply terminal 16. The anode of light emitting diode D3 is also connected to the junction of diode D2 and capacitor C1. The cathode of diode D3 is connected, through resistor R3, to the power supply terminal 16. A d.c. input terminal 11 is connected to a light responsive active circuit means comprising diode D4 and transistor T2. More particularly, the terminal 11 is connected to the cathode of diode D4 and collector of transistor T2. The anode of diode D4 is connected to the base of transistor T2, whose emitter is connected to terminal 13.

The output module 25 includes an input terminal 14, another input terminal 12 and an output terminal 15. Terminal 14 is connected through resistor R4 to the anode of a diode D5 whose cathode is connected to terminal 12. One plate of capacitor C2 is connected to terminal 14 and the other is connected to the cathode of diode D6 whose anode is connected to common return 17. A resistor R5 is connected in parallel with a diode D6 between the other terminal of capacitor C2 and the common return 17. The collector of a transistor T3 is connected, through resistor R6, to the power supply terminal 16. The base of transistor T3 is connected to the other terminal of capacitor C2 and the emitter of transistor T3 is connected, through resistor R7 to the common return 17. A resistor R8 connects the power supply terminal 16 to the collector of a transistor T4, the base of transistor T4 is connected to the emitter of transistor T3, and the emitter of transistor T4 is connected to the collector of transistor T4.

A review of FIG. 1A will show that the input module 20 includes a first circuit means connected between terminals 10 and 16 and including the light emitting diode D3. A second circuit means, also included in module 20 comprises the light responsive active circuit means including diode D4 and transistor T2 connected between terminals 11 and 13. The terminal 11 is one of two d.c. input terminals to the AND gate to provide bias for the transistor T2. The output module 25 includes the remainder of the biasing circuit for the light responsive active circuit means connected between terminals 14 and 12. Terminal 14 is coupled, through capacitor C2, to an amplifier comprising transistors T3 and T4 and associated components.

Light emitting diode D3, photo diode D4 and transistor T2 comprise an optically coupled isolator which is commercially available as a unit. This unit provides 2500 volt isolation between the diode D3 and the photo diode D4. This insulation level can be increased by well-known expedients in the art, such as by filling the space between diode D3 and D4 with glass or other insulating but light conducting materials.

Referring now to the first circuit means of the input module 20, under nominally quiescent conditions, that is with no dynamic signal present at terminal 10, no current will flow in the circuit. Any stray leakage current which is flowing in the circuit will, by reason of the connection of light emitting diode D3, be of the wrong polarity to produce a light signal and capacitive means C1 will tend to prevent such currents. When a dynamic input is present, that is an a.c. signal is applied to terminal 10, capacitor C1 will charge in such a manner as to tend to forward bias diode D3 in a circuit including capacitor C1, LED D3, R3 and T1. So long as the level of the dynamic signal provided at terminal 10 and the voltage across C1 is below that of the supply potential, applied to terminal 16, the capacitor C1 will charge. As the instantaneous amplitude of the a.c. signal applied to terminal 10 and the voltage across C1 rises above the power supply potential transistor T1 is turned on and capacitor C1 begins to discharge through a circuit including diode D3, resistor R3 and the transistor T1. This is possible, notwithstanding the positive supply potential applied to terminal 16, inasmuch as the net effect of the dynamic signal at terminal 10 and the charge on capacitor C1 raises the voltage on the capacitor C1 above that of the supply potential. It should be apparent to those skilled in the art that a constant potential applied to terminal 10 will not produce a light output from diode D3, regardless of the magnitude of such potential. It is only a dynamic signal which will have the effect of charging and discharging capacitor C1 such that a current flows through the light emitting diode D3 of the proper polarity to produce a light output. Furthermore the LED D3 has a minumum voltage threshold of about 1.5v. Therefore, the dynamic input must provide a signal, at the LED exceeding, this level for the LED to produce a light signal. More particularly, as the dynamic signal goes negative capacitor C1 charges, as shown, through D2, C1, D1 and R1. As the dynamic signal goes positive T1 is turned on, and C1 discharges through D3, R3 and T1.

The light produced by diode D3 is coupled to the light responsive active circuit means in the second circuit means of the input module 20. In order to produce an output this active circuit must be forward biased. Furthermore, in order to maintain the fail-safe qualities of the circuit proper regard must be had for the connection of a d.c. input signal between terminals 11 and 12. Terminal 11 is nominally the positive input and terminal 12 is nominally the negative input in that the active circuit means will only be properly biased for producing an output signal if the terminal 11 is above the terminal 12 in potential. One manner of providing a proper biasing is to connect terminal 12 to the common supply return 17. However, under these conditions the terminal 11 should not be connected to the positive supply potential, terminal 16. Instead, terminal 11 should only be connected to a vital source of positive potential, that is one derived from another vital circuit. On the other hand, terminal 11 may be safely connected to the common supply return 17. Under these conditions, to properly bias the active circuit means the terminal 12 will have to be connected to a source of negative potential which is larger, in absolute value, than the magnitude of the supply return 17. This is necessary in order to provide the proper bias for the active circuit means.

When forward biased, by a proper potential between terminals 11 and 12, the active circuit means will be enabled to respond to a light output from light emitting diode D3.

From the discussion above with respect to the first circuit means of input module 20, it will be apparent that any light signal from light emitting diode D3 must be dynamic in character, that it must follow the shape of the a.c. signal applied to terminal 10. Thus, when the light responsive active circuit means is forward biased it will produce a similar dynamic signal at terminal 14. This signal, coupled through capacitor C2, will provide an input to the amplifier which comprises the remaining portion of output module 25. Since there is in effect only one amplifying stage, that is transistor T4, the output at terminal 15 will be 180° out of phase with the input signal.

It will be appreciated, from the foregoing description, that the circuit illustrated in FIG. 1A performs an AND function since it requires the simultaneous presence of a dynamic input at terminal 10 and a proper d.c. input between terminals 11 and 12. Absence of either one of the input signals will prevent the generation of an output signal at terminal 15. Furthermore, any failure of the solid state components will tend to prevent the output signal and in no event will the failure of a solid state component allow the output signal to be produced in the absence of the proper input signals.

Figure 1B:
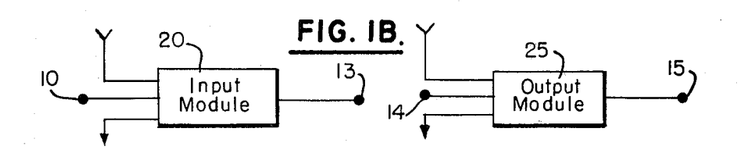
FIG. 1B shows the block diagram representation for the input module 20 and the output module 25.

FIG. 1B illustrates the block diagram representations that will be used hereinafter for the input module 20 and the output module 25. In some instances, in the drawings which will follow the connections between terminals 13 and 14 will not be illustrated and, instead, one blocked entitled AND gate 20, 25 will be used to represent the circuit which has its terminal 13 connected to the terminal 14.

Figures 1C, 2:
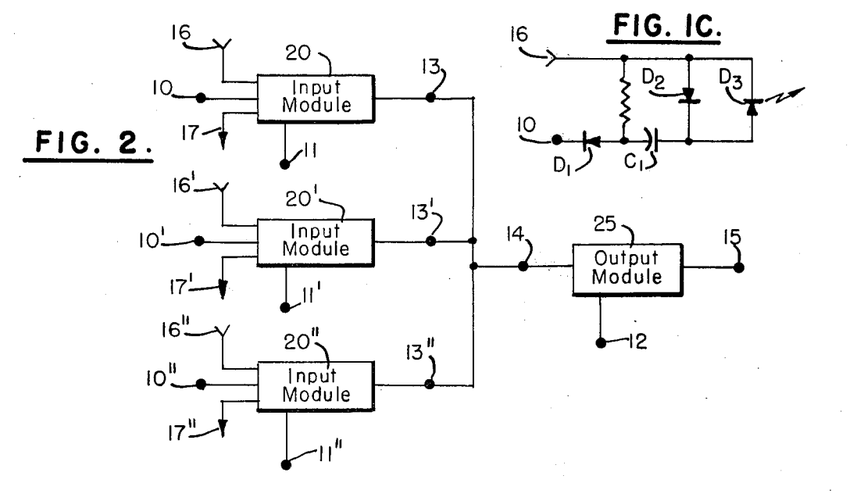
FIG. 1C is an alternative dynamic input circuit for input module 20.
FIG. 2 is a block diagram of an OR gate in accordance with the present invention.

FIG. 1C illustrates a variation of the first circuit means in which T1 is replaced by a resistor and in which the resistor R3 and R1 have been omitted. This circuit means in which too much T1 is replaced by a resistor and in which the resistors R3 and R1 have been omitted. This circuit requires slightly more current than the first circuit means shown in FIG. 1A, but otherwise operates in much the same fashion.

An OR gate can be formed in a number of different manners. One quite conventional OR gate is known as a wired OR gate which is merely a conductive connection between the output terminals of two different logic elements. When the output signals of these logic elements are to be always combined such a wired OR gate is useful and economical. However, when the foregoing logic functions are not always to be combined the wired OR gate is impractical. An OR gate can be provided using the input module 20 and the output module 25 illustrated in FIG. 1A, as shown in FIG. 2. FIG. 2 is a block diagram of a three input OR gate. That is a gate which is to produce an output when any one or more than one of three input signals are present. The OR gate of FIG. 2 has the advantage over the wired OR gate in that the input signals are maintained isolated one from another.

FIG. 2 shows three input modules 20, 20' and 20'' each having an output terminal 13, 13' and 13''. The output terminals 13, 13' and 13'' are wired in common and connected to the terminal 14 to provide an input to output module 25. Each of the input modules has an input terminal respectively 10, 10' and 10''. Each of these inputs may be connected to a different vital logic function. An output would be provided of a dynamic character at terminal 15 when any one or more of the inputs at terminals 10, 10' and 10'' were present so long as the proper connections are made to the d.c. input terminals. These input terminals comprise terminal 11, 11' and 11'' of the input modules and terminal 12 of the output module. Preferably, terminals 11, 11' and 11'' could be connected to the positive source of supply potential and terminal 12 would be connected to the common return. As should be apparent to those of ordinary skill in the art from an understanding of FIG. 1, any constant d.c. potential of appropriate magnitude applied between the terminals 11–12, 11'–12 and 11''–12 would provide proper operation. Furthermore for an OR gate with n inputs, n input modules are connected to a single output module.

Figure 3A:
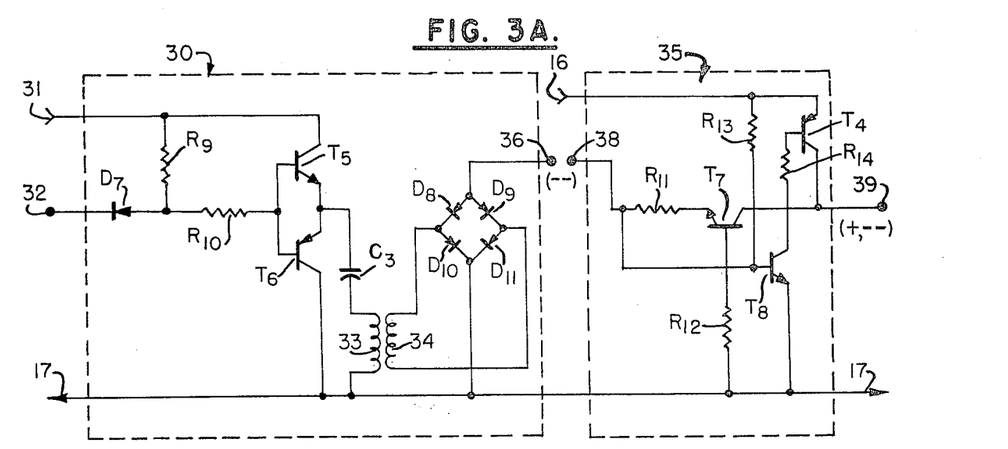
FIG. 3A is a schematic circuit diagram of a vital driver 30 and switching circuit 35 in accordance with the present invetion.

FIG. 3A illustrates the vital driver 30 and voltage responsive switch 35. Vital driver 30 accepts, as an input, the dynamic logic signal and produces, at its output, the "super minus" signal. Use of the "super minus" signal has been referred to in connection with the description of the AND gate of FIG. 1. The super minus signal is particularly useful in providing the d.c. input to the AND gate when terminal 11 is connected to common.

In FIG. 3A the dynamic input is provided to the vital driver at terminal 32. Terminal 31 is connected to a positive source of potential and terminal 17 is the common return. Connected between terminals 31 and 32 is resistor R9 and diode D7. The anode of diode D7 is connected to resistor R9 and the cathode is connected to terminal 32. A resistor R10 is connected between the anode of diode D7 and the bases of transistors T5 and T6, whose emitters are connected together. The collector of transistor T5 is connected to terminal 31 and the collector of transistor T6 is connected to common return 17. Transistors T5 and T6 are complementary in that transistor T5 is an NPN transistor and transistor T6 is a PNP transistor. The emitters of transistors T5 and T6 are connected to one plate of a capacitor C3. The other plate of a capacitor C3 is connected to one terminal of a primary winding 33 of a transformer. The other terminal of the primary winding is connected to the common return 17. The primary 33 and capacitor C3 are tuned to the frequency of dynamic input signal. The secondary 34 of the transformer is connected across the input terminals of a diode bridge comprising diodes D8 and D11. One output terminal of the diode bridge is connected to the output terminal 36 of vital driver 30. The other input terminal of the diode bridge is connected to the common return 17. The diode connections of the bridge are adjusted to provide a negative potential at terminal 36.

In operation, in the absence of a dynamic input signal at terminal 32, the transistors T5 and T6 are biased to conduction and a constant potential is dropped across capacitor C3. As a result of this static condition no voltage is induced in the secondary 34 and thus no output potential is produced at terminal 36. In the presence of a dynamic input signal at terminal 32 transistors T5 and T6 alternate between conduction and non-conduction. As the dynamic signal decreases in magnitude the base current, flowing through resistors R9 and R10 is shunted away from the transistors T5 and T6, to diode D7. As a result of the constantly changing potential at the emitters of transistors T5 and T6 the primary winding 33 induces an a.c. voltage in the secondary 34. By reason of the polarity of the diodes D8 through D11 and the diode bridge, the full-wave rectified voltage available at output terminal 36 is negative with respect to the common return 17. As a result, this is termed a "super minus".

The positive supply potential connected at terminal 31 can be variable depending upon the application of the vital driver. For instance, if the vital driver is used to provide a d.c. input to an AND gate such as the AND gate of FIG. 1, then the supply potential connected to terminal 31 will be the same as the supply potential connected to the AND gate, typically 6 volts. However, the same driver may be used to operate vital relays, signal mechanisms and switch circuit controllers up to 150 milliwatts. In this connection, the vital driver performs an output interface function and the terminal 31 can be connected to a nominal 12 volt source. By reason of the tuning of the driver, provided by the primary winding 33 and capacitor C3, it will respond only to signals of proper frequency. Thus, noise or self-oscillation signals will be rejected.

Figure 4:
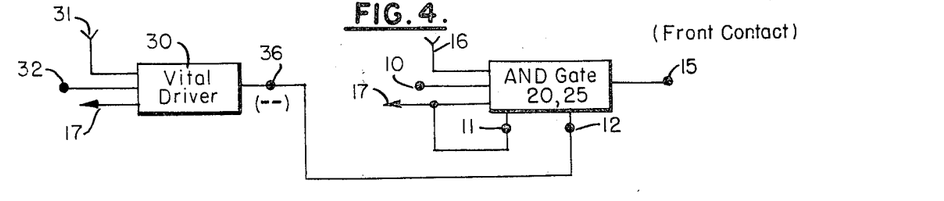
FIG. 4 is a block diagram of a circuit performing the same logic function as a front contact in accordance with the present invention.

FIG. 4 illustrates one application of a combination of a vital driver 30 (FIG. 3A) and the AND gate 20, 25 (FIG. 1) to simulate a front contact of a vital relay.

Referring first to the AND gate connections the d.c. input terminal 11 is connected to common return 17 while the input terminal 12 is connected to the output 36 of vital driver 30, so as to utilize the super minus signal. When dynamic inputs are provided to terminal 10 of the AND gate 20, 25 and to the terminal 32 of the vital driver 30 the AND gate output terminal 15 will produce a similar dynamic signal, thus simulating a front contact of a vital relay, that is one that is energized by a vital signal.

Figure 3B:
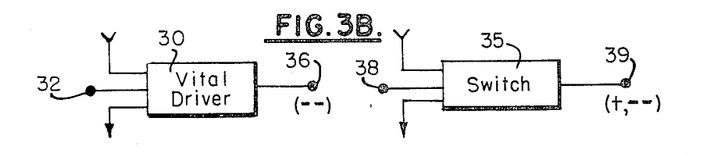
FIG. 3B shows the block diagram representation of the vital driver 30 and switch 35.

In some appications it is necessary to provide a switch which is capable of producing one or two d.c. voltages depending upon the input. Such a switch is shown in FIG. 3A as switch 35, and its block diagrammatic representation is shown in FIG. 3B. As is apparent from FIG. 3B, the switch 35 produces, at its output terminal 39 either a positive potential or a super minus potential.

In FIG. 3A the switch module 35 has a supply input terminal 16 and a return terminal 17, a signal input terminal 36 and a signal output terminal 39. A transistor T7 has its emitter connected, through R11, to the input terminal 38 and its collector connected to output terminal 39. The base of transistor T7 is connected, by resistor R12, to the return terminal 17. A transistor T8 has its base connected to input terminal 38 and, through resistor R13 to the supply terminal 16. The emitter of transistor T8 is connected to the return 17 and its collector is connected, through R14, to the base of the transistor T9. The emitter of T9 is connected to the supply potential and its collector to the output terminal 39.

When there is no input signal on terminal 38, transistor T8 is on, thus turning on transistor T9 and providing an output signal which is approximately equal to the supply potential connected at terminal 16. When a negative potential is provided at terminal 38, the transistor T8 is off which turns off transistor T9. However, transistor T7 is on and thus the negative potential applied at terminal 38 appears at the output terminal 39.

The switch 35 would normally be driven by a vital driver 30. Since the super minus output provided by vital driver 30 is not available from any other source, its presence at output terminal 39 is a vital signal. The positive potential can be produced at terminal 39 by any one of a number of circuit failures. However, the positive potential is not a vital indication and therefore its presence does not violate the fail-safe principle.

The block diagram representation for switch 35 is shown in FIG. 3B. In some instances, the vital driver 30 and the switch 35 will be shown directly adjacent without showing the connection between output terminal 36 and input terminal 38.

Figure 5:
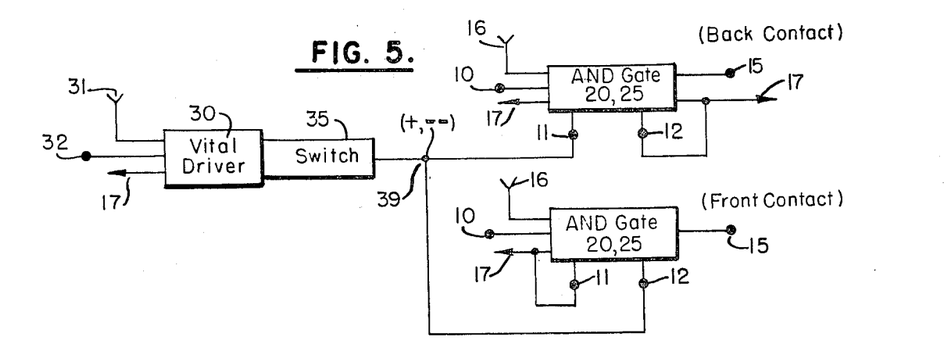
FIG. 5 is a block diagram showing a second circuit performing the same logic function as a front and back contact in accordance with the present invention.

FIG. 5 illustrates a circuit that performs a logic function similar to that of a front and back contact of a vital relay. A vital driver 30 is connected to a switch 35. One AND gate 20,25U has its input terminal 11 connected to the output of the switch 35 and its second input terminal 12 connected to common return 17. A second AND gate 20, 25L has its input terminal 11 connected to the supply return 17 and another input terminal 12 connected to the output of switch 35.

When a dynamic input is provided to vital driver 30, at terminal 32, the output terminal 39 of the switch 35 will provide the super minus. This super minus signal enables AND gate 20,25L such that a dynamic input is provided to its input 10, it will produce an output at its terminal 15. Thus, AND gate 20,25L and the vital driver 30, switch 35, performs the logic function that can also be performed by a front contact of a vital relay.

When the dynamic signal is absent from the vital driver 30, the output of switch 35 will be plus. This plus signal will enable AND gate 20,25U so that if a dynamic signal is present at its input terminal 10, it will produce an output at its terminal 15. Thus, AND gate 20, 25U, vital driver 30, and switch 35 performs logic function that can also be performed by the back contact of a vital relay.

Figure 6A:
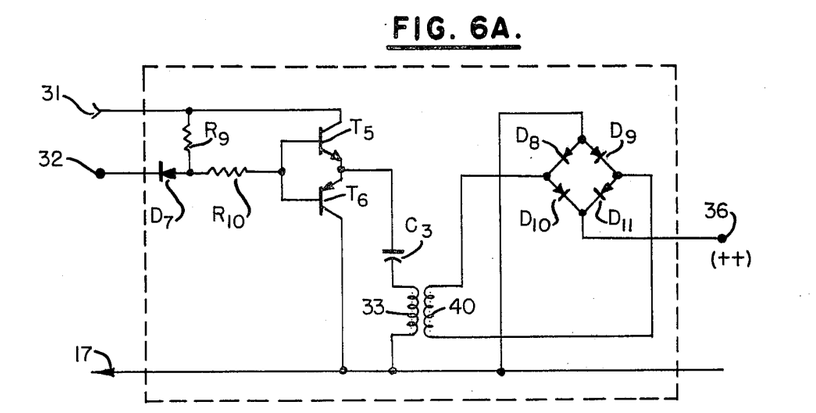
FIG. 6A is a circuit diagram of a modified vital driver 30'.

FIG. 6A illustrates a modified vital driver 30'. This vital driver will produce, at its output terminal 36, a super plus signal when a dynamic signal is presented to its input terminal 32.

Since the modified vital driver 30' is identical in most respects to the vital driver illustrated in FIG. 3A, we will only discuss here the modifications.

The secondary winding 40 has twice the number of turns of the secondary 34. Furthermore, the output connections of the diode bridge comprising diodes D8–D11 has been reversed such that a dynamic input signal causes a positive output from terminal 36.

By reason of the increased number of turns in the secondary 40, the output at terminal 36, when a dynamic signal is presented to terminal 32, will be approximately twice the nominal power supply potential applied at terminal 31.

Figure 6B:
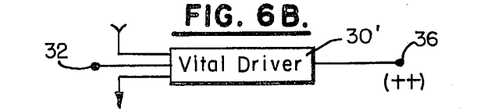
FIG. 6B is the block diagram representation of the modified vital driver 30'.

FIG. 6B illustrates the block diagram representation of the modified vital driver 30'.

Figure 7:
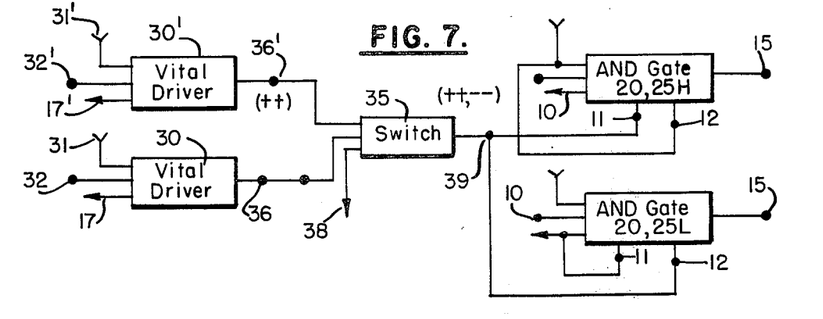
FIG. 7 is a block diagram showing a circuit performing the same logic function as vital form C contact in accordance with the principles of the present invention.

In FIG. 5 the AND gate 20,25L performed the logic function of the front contact of a vital relay, providing a vital output. However, the AND gate 20,25U, in performing the logic function of a back contact, provided a nonvital output. This is for the reason that the enabling potential applied at terminal 11 is not a vital signal. FIG. 7 illustrates how two AND gates 20,25H and 20,25B can perform the logic function of two vital front contacts, each responding to a different pair of vital signals.

In FIG. 7, a modified vital driver 30' has its super plus output, available at terminal 36', provided to the power input of a switch 35. A vital driver 30 has its super minus output, available at terminal 36, provided as the input signal to the switch 35. One AND gate 20,25H has its input 11 connected to the output of the switch 35 and its other input 12 connected to the positive supply potential. The second AND gate 20,25B has its input 11 connected to the supply return and its input 12 connected to the output of switch 35. A dynamic input at terminal 32' of the modified vital driver 30' will produce a super plus signal. We can refer to FIG. 3A to determine the output of switch 35. In FIG. 3A when no input is available at terminal 38, the control transistor T8 is on, turning on the other transistor T9. As a result, the supply potential, available at terminal 16, is provided to the output terminal 39. Since, in FIG. 7, the supply potential provided the switch 35 is the super plus, the output of switch 35 will be the super plus signal when a dynamic signal is absent from input 32. Inasmuch as the input terminal 12 of AND gate 20,25H is connected to the positive supply potential, AND gate 20,25H will only be enabled if the super plus is provided to its terminal 11. Those skilled in the art will understand that the super plus is a vital signal since it is not available from any other supply and can only be produced from switch 35 by reason of the action of the modified vital driver 30'Thus, when a dynamic signal is provided to AND gate 20, 25H, it will produce an output signal. This output signal will be a vital signal which can be present only upon the simultaneous presence of dynamic signals at input 10 to AND gate 20, 25H and input 32' to the vital driver 30'.

On the other hand, when the dynamic signal is present at the vital driver 30, the switch 35 will produce the super minus signal as has been referred to previously. By reason of the connections to AND gate 20, 25B this super minus signal will enable this AND gate. Thus, when a dynamic signal is provided to the input 10 of AND gate 20, 25B, it will produce an output signal at its terminal 15. Since the AND gate 20, 25B was enabled only under the combined presence of a dynamic signal at its input terminal 10 and the vital super minus signal at its input terminal 12, the output of AND gate 20, 25B will also be a vital signal.

For small loads the vital driver output or an amplified vital driver output can be utilized as a power source. However, for larger loads a solid state switching circiut will serve to connect a power source to the load. Such solid state switching circuits are known to the art.

The solid state switching circuit will be controlled by the logic signal which, since it comprises a vital signal, will be fail-safe. However, since the solid state switching circuit may not be fail-safe, power check logic is provided to check the proper operation of the power delivering system. Such power check logic is illustrated in FIG. 8.

Figure 8:
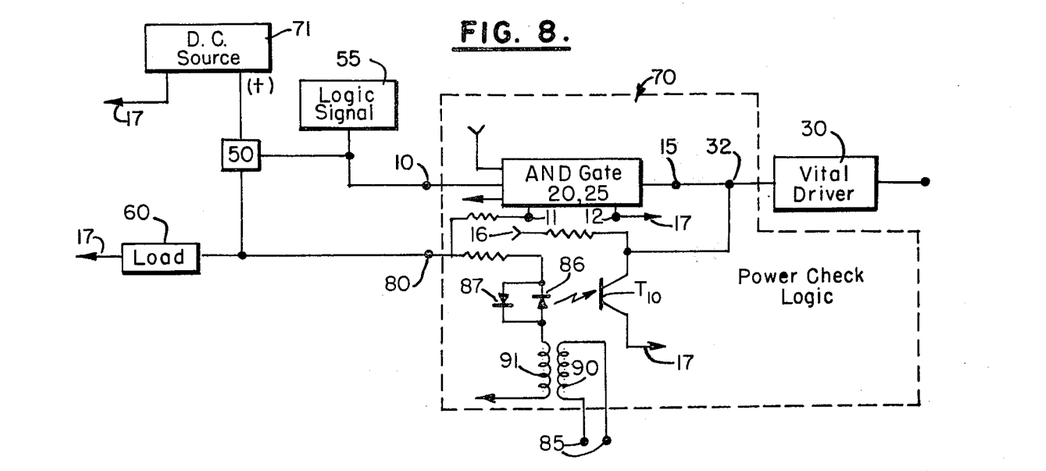
FIG. 8 is a part block and part circuit diagram of a power check logic module in accordance with the present invention.

FIG. 8 shows a d.c. source 71 connected between a common return 17 and a switching circuit 50 which may be solid state. A load 60 is connected between the common return 17 and the output of the switching circuit 50. Thus, when the switching circuit 60 is enabled, the d.c. source 71 supplies power to the load 60. Switching circuit 50 receives an enabling input from a logic signal source 55. The logic signal source 55 serves to represent one or more logic elements in a logic system. The logic signal source 55 produces a dynamic signal of the character referred to previously and its presence is designed to energize the load 60. By reason of the power requirements of load 60, a vital driver is inadequate. For that reason, the switching circuit 50 serves to connect the d.c. source 71 to the load 60 in response to application of the logic signal.

The power check logic 70 is designed to monitor the application of power to the load by the switching circuit 50 and to indicate, by the absence of an output from vital driver 30, unsafe operation.

The power check logic 70 includes an AND gate 20, 25 connected to a vital driver 30. In addition, a sensing circuit is responsive to the condition when no power is applied to the load to produce another signal to enable vital driver 30. The power check logic 70 includes an input terminal 10 for the AND gate 20, 25 and a second input terminal 80 which is connected in common with the load 60. In addition, a clock signal is applied to terminals 85. The clock signal may be similar in frequency to the dynamic signal which is used as a vital logic signal. However, as this description proceeds it will become apparent that the clock signal applied at terminals 85 is not a vital signal.

The clock signal applied across terminals 85 is applied to the primary winding 90 of a transformer. The secondary winding 91 is connected between common return 17 and the anode of a light emitting diode 86. The diode 87 is a protection diode for diode 86. The cathode of the light emitting diode 86 is connected through a resistor to the input terminal 80. A light responsive active circuit means comprising a transistor T10 has its emitter connected to the common return and its collector connected, through a resistor, to a power supply potential. The collector of transistor T10 is connected as one input to vital driver 30. The same logic signal which activates switching 50 also is provided as an input to an AND gate 20,25. The input terminal 12 of the AND gate 20,25 is connected to common return and the input terminal 11 is connected to power check logic input terminal 80.

When the switching circuit 50 is open and thus no power is applied to the load, the dynamic signal provided at terminal 85 produces a dynamic signal in the transformer secondary 91 which serves to energize light emitting diode 86. This light signal provides a dynamic output at the collector of transistor T10. This dynamic signal energizes vital driver 30 to provide an output indicative of proper operation.

In the event that power is applied to the load, the d.c. potential applied at terminal 80 back biases light emitting diode 86 thus preventing it from providing a light signal to the transistor T10.

However, the d.c. potential at terminal 80 enables AND gate 20, 25 through terminal 11. If a logic signal 55 is present, it will thus cause AND gate 20, 25 to produce a dynamic output signal at terminal 15. This signal will serve to drive the vital driver producing an output indicative of proper operation. If, for some reason, power is applied to the load and the logic signal is absent, of course, a dynamic signal will not be produced by either AND gate 20, 25 or the transistor T10. As a result, the vital driver 30 will not produce an output. This serves as an indication of inappropriate application of power to the load 60. This lack of an output signal from vital driver 30 can be used to disable the d.c. source 71.

As an alternative the power check logic 70 could be modified by omitting LED 86, diode 87 and transistor T10. In this embodiment one terminal of winding 91 is connected to the terminal of the resistor which was connected to the cathode of LED 86. The same terminal is connected to terminal 32. The core around which windings 90 and 91 are wound must be made of material with a square hystersis loop. In this arrangement, in the absence of power applied to load 60, the dynamic signal at terminals 85 is induced into winding 91 and is therefore applied to the vital driver 30. However when power is applied to load 60 the winding 91 is saturated and therefore the flux changes caused by the dynamic signal at terminals 85 do not develop a voltage in winding 91.

Either the isolating means of LED 86 and transistor T10 or the square-loop transformer may be used.

Figure 9:
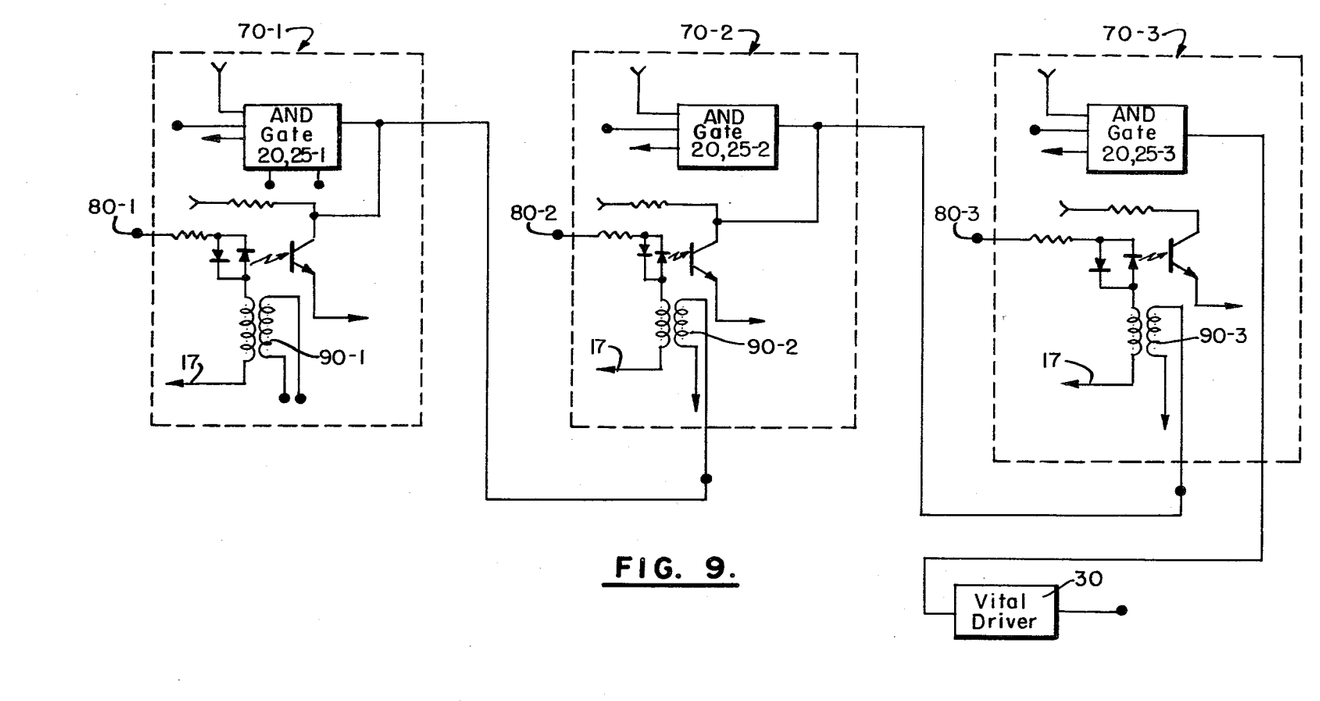
FIG. 9 is a part block and part circuit diagram of the manner in which a plurality of power check modules may be interconnected in accordance with the principles of the present invention.

FIG. 9 illustrates the manner in which a plurality of power check logic circuits can be cascaded together such that proper operation of each is necessary to prevent disabling of a power source.

FIG. 9 illustrates three power check logic circuits 70-1, 70-2 and 70-3. Each of the components of power check logic illustrated in FIG. 9 are identical and each has its input terminal 80-1, 80-2 and 80-3 respectively connected to a different load. In a similar manner each of the input terminals of AND gates 20,25-1, 20,25-2 and 20,25-3 connected to a different logic signal associated with the load which is connected to the respective power sensing terminal 80. The dynamic output of power check logic 70-1 which is indicative of proper operation is provided as the dynamic input to primary winding 90-2 of power check logic 70-2. In a similar manner the dynamic output of power check logic 70-2 which is indicative of proper operation is provided as the dynamic input to winding 90-3. Finally, the dynamic output of power check logic 70-3 is provided as an input to vital driver 30. Thus, when vital driver produces an output it is indicative of proper operation of each of the power check logics which is, in turn, indicative of proper operation of each of the power delivery circuits being monitored.

Of course, the modified power check logic employing the square-loop transformer could also be used in the circuit of FIG. 9.

As mentioned above, the vital driver 30, or modified vital driver 30', or a combination of vital driver 30 and switch 35, can receive a dynamic input and produce an output indicative of the receipt, or non-receipt of such a dynamic input. The logic gates, disclosed above, require two inputs, both a dynamic input and a d.c. input. The dynamic input can, clearly, be derived from the output of other logic gates. However, some apparatus must be provided to generate the d.c. input for the logic gate. The vital driver or combination of vital driver and switch 35 is one such apparatus which, in response to application of a dynamic signal, will produce a d.c. output capable of supplying the biasing potentials required as the d.c. input for a logic gate. Those of ordinary skill in the art will understand that the dynamic input for the vital driver can be derived from the output of a preceeding logic gate. In this fashion, more complex logical functions can be performed employing the apparatus comprising the logic system of my invention.

As is disclosed above the vital driver includes a tuned circuit such that only dynamic signals of proper frequency will produce an alternating current signal which, when rectified by the full wave rectifier in the vital driver, will produce the d.c. output of desired magnitude and polarity.

Thus, the invention provides a fail-safe solid state family of logic circuits. In addition, these logic circuits can be combined with other novel circuits to perform the logic functions that are associated with front and back contacts of vital relays and also to check the proper operation of switching circuits operated in response to the logic signals. Many variations upon the specific structure disclosed herein will occur to those skilled in the art within the scope of the present invention. For instance, the optically coupled isolator is one convenient means to be employed in the AND gate, although under certain circumstances equivalent isolators could be employed such as a Hall-effect device.

What is claimed is:

1. A fail-safe solid state logic gate responsive to dynamic and d.c. inputs without requiring a transformer comprising,
 a first circuit means connected between a dynamic input terminal and a power supply terminal and having LED means poled to be reversed biased by said power supply, and producing a dynamic light output in response to a dynamic input above a predetermined threshold,
 second circuit means including a light responsive active circuit means biased by said d.c. input and responsive to said dynamic light output,
 and an output circuit including amplifier means and responsive to said light responsive active circuit means for producing a dynamic output only when a dynamic input is provided to said first circuit means and said light responsive active circuit means is properly biased by said d.c. input.

2. The gate of claim 1 which comprises and AND gate for producing a vital signal in which said d.c. input comprises positive and negative terminals with said positive terminal connected to system common.

3. The gate of claim 1 which comprises an AND gate for producing a vital signal in which said d.c. input comprises positive and negative terminals with said negative terminal connected to system common and said positive terminal connected to a vital positive source.

4. The gate of claim 1 in which said first circuit means further includes unidirectional conduction means and capacitor means connected between said dynamic input terminal and said LED means with said unidirectional conduction means poled to be forward biased by said power supply,
 and impedance means connected between said power supply terminal and a terminal common to said capacitor means and said unidirectional conduction means.

5. The gate of claim 4 in which said impedance means comprises a resistor.

6. The gate of claim 4 in which said impedance means comprises an active circuit element.

7. The gate of claim 4 in which said impedance means comprises a transistor.

8. A circuit for simulating a vital relay with a back contact including the gate of claim 1,
 said gate having a positive and negative d.c. input terminals,
 means for converting a second dynamic signal to a d.c. signal of negative polarity, greater and absolute value than a circuit common,
 switching means connected to said last named means for producing, at an output terminal, a d.c. signal of negative polarity, greater in absolute value than said circuit common when said second dynamic signal is applied to said means for converting and for conducting, to said output terminal, a power supply potential in the absence of said second dynamic signal,
 means for connecting said negative d.c. input terminal to said circuit common and said positive d.c. input terminal to said switching means output terminal.

9. A logic circuit for monitoring the application of power to a load in response to a logic signal and for indicating that power has been applied to said load in the absence of said logic signal, including the logic gate of claim 1 and further comprising,
 an input terminal connected to said load,
 third circuit means connected to said terminal including LED means so poled as to be reversed biased by application of power to said load,
 a second dynamic input, said LED means responsive to said second dynamic input so as to produce a dynamic light output in response to said second dynamic input only when power is not applied to said load,
 second light responsive active circuit means with an output to produce a dynamic signal in response to said dynamic light output, said logic gate having a positive and a negative d.c. input terminal for properly biasing said light responsive active circuit means in said second circuit means, means connecting said negative d.c. input terminal to circuit common and means connecting said positive d.c. input terminal to said input terminal connected to said load, said logic gate amplifier means having an output connected in common with said output of said second light responsive active circuit means, whereby a dynamic output at said common output indicates a safe condition and absence of a dynamic output indicates an unsafe condition.

10. A system for monitoring proper power application of power to $n$ loads including $n$ logic circuits of claim 9, one logic circuit for each load.

11. A system of claim 10 which said second dynamic input of one said logic circuit $n$ is connected to said common output of logic circuit $n-1$.

12. A system of claim 10 in which each said second dynamic input of each logic circuit except one is connected to said common output of a preceding logic, and means connecting said one logic circuit second dynamic input to a dynamic signal.

13. A logic circuit connected between supply potential and circuit common and having a first gate of claim 1 and a second identical gate, said circuit enabling said first gate in the presence of a first dynamic signal and for enabling said second gate in the presence of both a second dynamic signal and said first dynamic signal comprising, first means for converting with an input and output, means connecting said first dynamic signal to said input, said first means producing, at said output, a d.c. potential greater than said supply potential in the presence of said first dynamic signal, second means for converting, with an input and output, means connecting said second dynamic signal to said input, said second means producing, at said output, a d.c. potential negative with respect to said circuit common at said output in the presence of said second dynamic signal, switching means with two inputs and an output, means connecting one input of said switching means to said output of said first means for converting, means connecting another input of said switching means to said output of said second means for converting, said switching means providing at its output the output of said second means for converting in the presence of said second dynamic signal and the output of said first means for converting in the absence of said second dynamic signal, both said logic gates having positive and negative d.c. input terminals for biasing said light responsive circuit means when a positive d.c. potential is applied across said d.c. input, means connecting said switching means output to d.c. inputs of both said logic gates for enabling said second logic gate in the presence of said first and second dynamic signals and for enabling said first logic gate in the presence of only said first dynamic signal.

14. The logic circuit of claim 13 in which said last maned means includes, means connecting said negative d.c. input terminal of said first logic gate to said supply potential, means connecting said positive d.c. input terminal of said second gate to said circuit common, and means connecting said positive d.c. input terminal of said first logic gate and said negative d.c. input terminal of said second logic gate to said output terminal of said switching means.

15. A logic circuit for monitoring the application of power to a load in response to a logic signal and for indicating that power has been applied to said load in the absence of said logic signal, including the logic gate of claim 1 and further comprising, an input terminal connected to said load, third circuit means connected to said terminal including isolating means, a second dynamic input, said isolating means responsive to said second dynamic input so as to produce a dynamic output in response to said second dynamic input only when power is not applied to said load, said logic gate having a positive and a negative d.c. input terminal for properly biasing said light responsive active circuit means in said second circuit means, means connecting said negative d.c. input terminal to circuit common and means connecting said positive d.c. input terminal to said input terminal connected to said load, said logic gate amplifier means having an output connected in common with said output of said isolating means, whereby a dynamic output at said common output indicates a safe condition and absence of a dynamic output indicates an unsafe condition.

16. A fail-safe solid state logic gate responsive to dynamic and d.c. inputs without requiring a transformer comprising, at least one input module and an output module, said input module including first and second circuit means, said first circuit means connected between a dynamic input terminal and a power supply terminal and having LED means poled to be reversed biased by said power supply, and producing a dynamic light output in response to a dynamic input above a predetermined threshold, said second circuit means including a light responsive active circuit means biased by said d.c. input and responsive to said dynamic light output, said output module including amplifier means and responsive to said light responsive active circuit means for producing a dynamic output only when a dynamic input is provided to said first circuit means and said light responsive active circuit means is properly biased by said d.c. input.

17. The gate of claim 16 which comprises an AND gate for producing a vital signal in which said d.c. input comprises positive and negative terminals with said positive terminal connected to system common.

18. The gate of claim 16 which comprises an OR gate with $n$ inputs, $n$ input modules, a light responsive active circuit means in each of said input modules being connected to said amplifier means.

19. A circuit for simulating a vital front contact of a relay including the gate of claim 17 and further having, a second dynamic input, means for converting said second dynamic input to a d.c. voltage of negative polarity and larger, in absolute value, than a system common, and means connecting said negative terminal to said means for converting.

20. The circuit of claim 19 in which said means for converting includes, a tuned transformer responsive to said second dynamic input, and a full-wave rectifier connected to a secondary of said transformer.

21. A solid state fail-safe circuit for simulating a vital relay with front and back contacts including, means for converting a dynamic signal to a d.c. signal of negative polarity with absolute value greater than a circuit common and for producing a d.c. signal equal to supply potential in the absence of said dynamic signal, said means having an output terminal, a first logic circuit means for simulating a back contact comprising, a dynamic input terminal, amplifier means responsive to a dynamic signal applied at said terminal only when properly biased by d.c. potentials, a positive and a negative input terminal for supplying said d.c. potentials, means connecting said negative input terminal to said circuit common and means connecting said positive input terminal to said output terminal of said means for converting, a second logic circuit means for simulating a front contact, said second logic circuit means identical to said first logic circuit means with said positive input terminal connected to said circuit common and said negative input terminal connected to said output terminal of said means for converting, whereby, with the co-joint presence of dynamic signals at said means for converting and said second logic circuit means said second logic circuit means produces a dynamic output, and with the absence of a dynamic signal at said means for converting and with the simultaneous presence of a dynamic signal at said first logic circuit means, said first logic circuit means produces a dynamic output.

22. A fail-safe logic gate responsive to dynamic and d.c. inputs without requiring a transformer and which prevents production of spurious signals due to leakage currents, comprising, first circuit means connected between a dynamic input terminal and a power supply terminal with LED means and capacitive means serially connected to prevent leakage currents from producing spurious signals, and producing a dynamic light output in response to a dynamic input above a predetermined threshold, second circuit means including a light responsive active circuit means biased by said d.c. input and responsive to said dynamic light output, and an output circuit responsive to said light responsive active circuit means for producing a dynamic output only when a dynamic input is provided to said first circuit means and said light responsive active circuit means is forward biased by said d.c. input.

23. The gate of claim 22 in which said LED means is connected in said first circuit means to be reverse biased by said power supply.

24. The gate of claim 22 which comprises an AND gate for producing a vital signal in which said d.c. input comprises positive and negative terminals with said positive terminal connected to system common.

25. The gate of claim 22 which comprises an AND gate for producing a vital signal in which said d.c. input comprises positive and negative terminals with said negative terminal connected to system common and said positive terminal connected to a vital positive source.

26. The gate of claim 23 in which said first circuit means further includes unidirectional conduction means connected between said dynamic input terminal and said capacitive means with said unidirectional conduction means poled to be forward biased by said power supply, and impedance means connected between said power supply terminal and a terminal common to said capacitive means and said unidirectional conduction means.

27. The gate of claim 26 in which said impedance means comprises a resistor.

28. The gate of claim 26 in which said impedance means comprises an active circuit element.

29. The gate of claim 26 in which said impedance means comprises a transistor.

30. A fail-safe logic gate responsive to dynamic and d.c. inputs without requiring a transformer and which prevents production of spurious signals due to leakage current, comprising, first circuit means connected between a dynamic input terminal and a power supply terminal and having LED means poled to be reverse biased by said power supply, and producing a dynamic light output in response to a dynamic input above a pre-determined threshold, second circuit means including a light responsive active circuit means biased by said d.c. input and responsive to said dynamic light output, and an output circuit responsive to said light responsive active circuit means for producing a dynamic output only when a dynamic input is provided to said first circuit means and said light responsive active circuit means is forward biased by said d.c. input.

31. The gate of claim 30 which further includes capacitive means serially connected to said LED means.

32. The gate of claim 31 which comprises an AND gate for producing a vital signal in which said d.c. input comprises positive and negative terminals with said positive terminal connected to system common.

33. The gate of claim 31 which comprises an AND gate for producing a vital signal in which said d.c. input comprises positive and negative terminals with said negative terminal connected to system common and said positive terminal is connected to a vital positive source.

34. The gate of claim 31 in which said first circuit means further includes unidirectional conduction means connected between said dynamic terminal and said capacitive means with said unidirectional conduction means poled to be forward biased by said power supply, and impedance means connected between said power supply terminal and a terminal common to said capacitive means and said unidirectional conduction means.

35. The gate of claim 34 in which said impedance means comprises a resistor.

36. The gate of claim 34 in which said impedance means comprises an active circuit element.

37. The gate of claim 34 in which said impedance means comprises a transistor.

* * * * *